United States Patent [19]

Smith et al.

[11] Patent Number: 4,620,761

[45] Date of Patent: Nov. 4, 1986

[54] HIGH DENSITY CHIP SOCKET

[75] Inventors: Brian M. Smith, Mansfield; Emanuel D. Torti, Boston, both of Mass.

[73] Assignee: Texas Instruments Incorporated, Dallas, Tex.

[21] Appl. No.: 696,663

[22] Filed: Jan. 30, 1985

[51] Int. Cl.[4] .............................................. H01R 9/09
[52] U.S. Cl. ........................... 339/75 MP; 339/17 CF; 339/252 S
[58] Field of Search .......... 339/17 LF, 75 M, 75 MP, 339/252 S, 255 R

[56] References Cited

U.S. PATENT DOCUMENTS

| | | | |
|---|---|---|---|
| 3,290,636 | 12/1966 | Overtveld | 339/17 CF |
| 4,029,375 | 6/1977 | Gabrielian | 339/255 R |
| 4,130,327 | 12/1978 | Spaulding | 339/17 CF |
| 4,330,163 | 5/1982 | Aikens et al. | 339/75 MP |
| 4,378,139 | 3/1983 | Griffin | 339/17 CF |

FOREIGN PATENT DOCUMENTS 2920943  11/1979  Fed. Rep. of Germany ... 339/17 CF

Primary Examiner—John McQuade
Attorney, Agent, or Firm—John A. Haug; James P. McAndrews; Melvin Sharp

[57] ABSTRACT

An interconnection system for high density I/O sites on an I.C. Interconnection substrate allowing field replacement thereof has a socket body with an array of contact springs adapted to be removably biased into engagement with conductive pads on the bottom surface of the substrate. The contact springs have a tail portion depending from the socket body which are affixed to a printed board. The substrate is locked into place on the socket body by removable latches.

4 Claims, 9 Drawing Figures

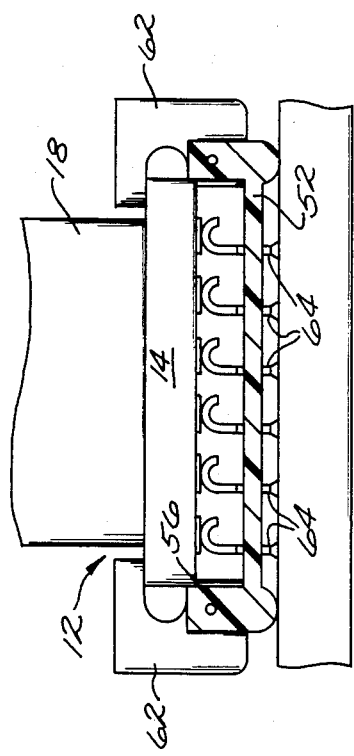
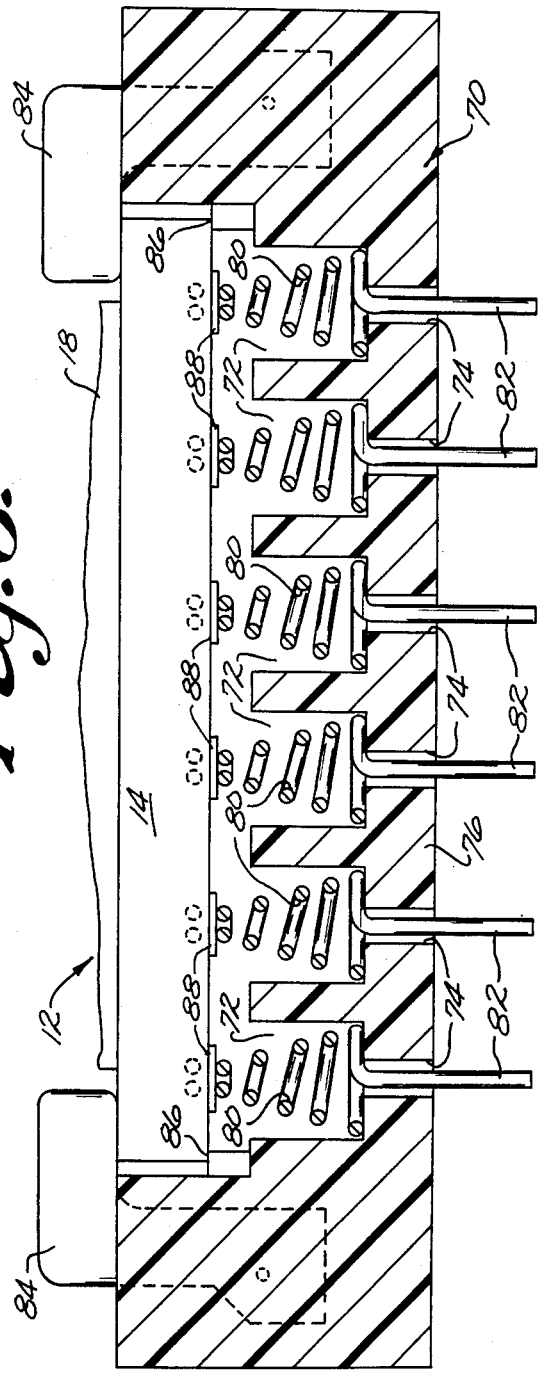

HIGH DENSITY CHIP SOCKET

FIELD OF THE INVENTION

The invention relates generally to electronic interconnection systems and more specifically to high density interconnection of field replaceable modules each containing a plurality of integrated circuit chips with a printing writing board.

BACKGROUND OF THE INVENTION

The development of integrated circuits has resulted in a great increase in the number of circuits and circuit components per unit area in circuit layouts and has necessitated the development of new ways of interconnecting such circuits to the system in which they are to be used. One device developed to answer this new need has become ubiquitous and is commonly referred to as a DIP (dual-in-line) package or socket. An integrated circuit (I.C.) is mounted on an electrically conductive strip of metal which is formed to have two rows of leads. Thin wires are bonded between selected pads on the I.C. and respective leads. Typically this is then encased in plastic or ceramic to form an I.C. package with the leads depending downwardly therefrom in two parallel rows. A separate body or socket of electrically insulating material is formed with a pair of rows of recesses. A contact spring member is placed in each recess and is formed with a tail pin such as a solder tail or wire wrap pin extending through an aperture in the bottom wall of the recess. The body or socket is typically placed on a printed circuit board having selected apertures therein, along with other similar sockets, with the tail pins received in the apertures which are then fixed to the p.c. board. The I.C. package can then be removably mounted on a socket by pushing the downwardly depending leads into the recesses in the socket where they make electrical engagement with the spring contacts.

Over the years more and more circuit functions have been built into integrated circuit chips requiring an ever increasing number of pins for interconnection to the I.C. package. For practical considerations the maximum industry standard for DIP sockets has been set at 64 pins. For chips requiring even more inputs/outputs several approaches have been followed including the use of two double rows of pins. In addition a different lead layout has become common in which leads are directed to the extremity of four sides of the package to form a rectangular lead layout. The package is receivable in a mating socket having contact spring members arranged around a rectangular I.C. package seating surface with the spring members formed with tail pins similar to the DIP sockets but forming a rectangular layout. This type of socket is suitable for I/O's of up to 124 in number. Increased numbers of I/O's are not feasible because the distance of the lead from the I.C. to the pin becomes too long and adversely effects the time required for transmission of electrical signals. In addition, due to the closeness of the leads to one another, the lead frame typically must be made by etching rather than stamping which significantly adds to the cost of the device.

Functional circuit capacity and the physical size of printed circuit boards for large systems have continued to increase in response to performance demands. A recent improvement in interconnecting integrated circuits in such a system involves the use of a module comprising a layered substrate with a plurality of integrated circuit chips soldered to a surface thereof. Wiring interconnections are built into the substrate utilizing a number of copper power reference planes. A heat removal system is mounted in heat transfer relation with the I.C. chips and pins are brazed to metal pads on an opposite side of the substrate. An array of bifurcated springs each having a solder tail stem is placed at a selected site on a printed wiring board with the stems inserted in plated through holes and soldered to the board. A plastic frame fits over and aligns the springs. The module is aligned at the site, then it is moved toward the board such that the pins are adjacent the bifurcated springs and the module is then moved in a plane parallel to the surface of the board so that the pins are inserted into the bifurcations of the springs.

By way of example one such module is approximately 90 mm by 90 mm by 4.6 mm thick. One side has up to 118 I.C. chips soldered to its surface while 1800 pins are brazed to metal pads on the opposite side.

Due primarily to the extreme density of the input-/output sites on the module substrate, the pin and bifurcated spring interconnection system is characterized by several limitations including problems involved with misalignment of one or more pins in an array. Although the bifurcated spring is flexible and can accommodate some pin misalignment, this capability is very limited since the spacing between pins in such an array is as little as 1.77 mm. Misalignment of pins will lead to costly rework or even scraping of the entire substrate and I.C. chips mounted thereon. Another limitation is the expense involved in brazing the pins to the metal pads on the substrate which is a relatively expensive manufacturing operation. Still another problem is a potential thermal expansion mismatch at varying temperature ranges between the substrate material (e.g. layered copper and alumina) and the pin material, typically an ion, nickel and cobalt alloy plated with a noble metal.

SUMMARY OF THE INVENTION

It is therefore an object of the invention to provide a new connector system to accommodate high density I/O sites, in the order of 1800 sites, in an area as small as 90×90 mm. Another object of the invention is to provide an improved interconnection system which readily permits field replacement of I.C. modules. Yet another object is the provision of a pluggable interconnection system which has generally the same degree of reliability as that of conventional solder joints in a non-pluggable system. Another object is the provision of an improved high density connector system which is reliable yet easily manufacturable and of low cost. Yet another object of the invention is to provide an interconnection system for a substrate mounting a plurality of I.C. chips which eliminates the use of pins employed in prior art systems. These, as well as other objects and advantageous features of the present invention, will be in part apparent and in part pointed out hereinafter.

Briefly, in accordance with the invention, a module comprising a substrate having a plurality of I.C. chips mounted on a generally planar face thereof is provided with a dense array of I/O pads on its opposite generally planar face. A socket body adapted to mount the module on a module receiving seat has a matching array of contact springs mounted on the body which extends upwardly above the plane on which the module is seated. Solder tail stems depend from the contact springs through apertures in the socket body and are received in plated through holes in a printed wiring board and are permanently attached by soldering thereto. A module is placed on the module receiving seat with the contact springs depressed generally to the plane of the module receiving seat to thereby provide a selected level of contact force between the I/O pads and the contact spring. In a first embodiment the contact springs are in the form of a cantilever beam, generally "J" shaped with the outer portion of the curved section adapted to engage the I/O pad. As the contact spring is depressed, there is a slight wiping motion of contact spring against the pad to thereby provide optimum clean contact surfaces. In a second embodiment the contact springs are in the form of conical coil springs which are movable along a Z axis and essentially immovable along the X and Y axes to provide more dependable alignment. The module is locked in place by suitable fastening means such as screw fasteners or pivotable tabs or levers mounted on the socket body and pivotable into and out of a locking position capturing a module seated in the module receiving seat.

BRIEF DESCRIPTION OF THE DRAWINGS

FIG. 8 is a cross sectional view showing a module having a plurality of I/O site pads seated on the socket body with the "J" spring contacts in electrical engagement with the I/O site pads.

FIG. 9 is a cross sectional view showing a module having a plurality of I/O site pads seated in a socket body with conical coil spring contacts in electrical engagement with the I/O site pads;

Corresponding reference characters indicate corresponding parts throughout the several views of the drawing.

The examples set forth herein illustrates the preferred embodiments of the present invention in several forms thereof and are not to be construed as limiting in any manner the scope of the invention or the disclosure thereof.

DESCRIPTION OF THE PREFERRED EMBODIMENT

Figure 1:
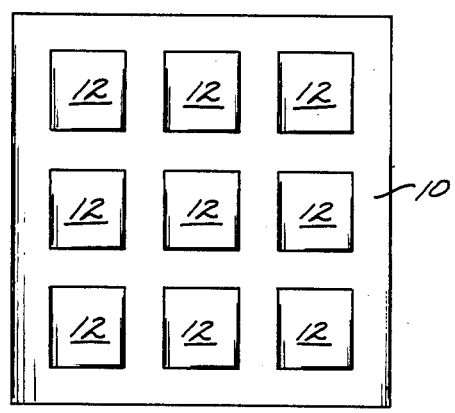
FIG. 1 is a plan view of a printed wiring board on which are mounted a plurality of modules each of which in turn comprise an interconnection substrate on which a number of I.C. chips are mounted along with a heat removal system.
Figure 2:
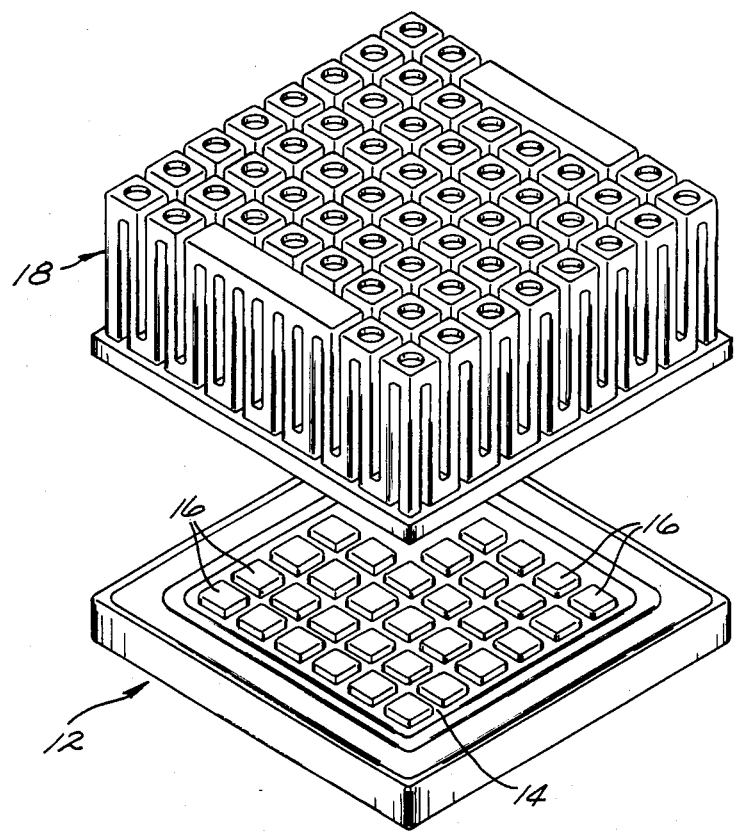
FIG. 2 is a perspective view of one of the modules shown in FIG. 1 with the heat removal system separated from the substrate.
Figure 3:
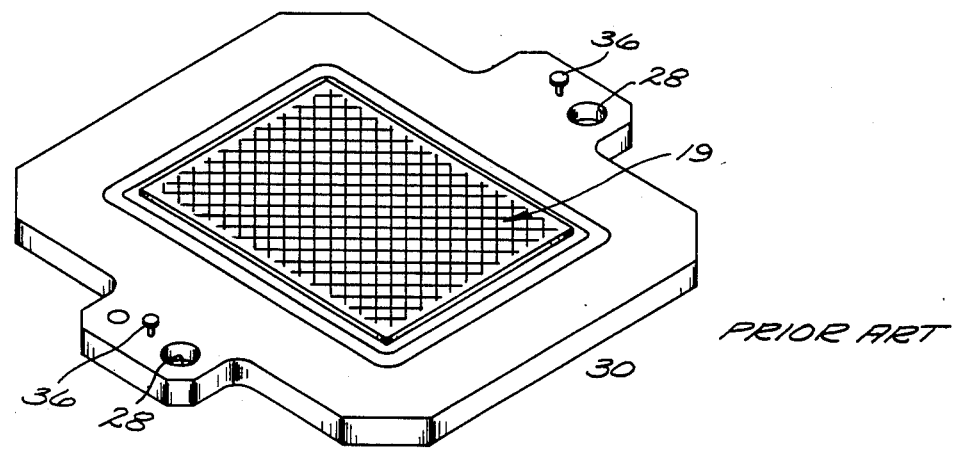
FIG. 3 is a perspective view of the bottom of a prior art module in a mounting frame showing an array of high density I/O pins projecting from a substrate.

FIG. 1 shows a printed board 10 of the type used in information processing equipment such as the 3081 Processor of International Business Corporation. In that processor board 10, which is 600 by 700 mm in size, mounts nine multichip modules 12 each of which are 90 by 90 by 4.6 mm in size. The modules comprise a substrate 14 having a plurality of layers having printed wiring interconnections for up to 118 I.C. chips 16 soldered to a top, generally planar surface of the substrate. Heat generated in the chips is removed by a heat exchanger 18 fastened to the outer surface of module 12. On the lower surface of module 12, as seen in FIG. 3, an array 19 of 1800 pins is brazed to metal pads on the substrate. The pins, 2 mm in length and 0.3 mm in diameter, are disposed in two staggered grids of columns and rows of 30 each with the pins of a grid being space 2.5 mm apart and a minimum spacing between pins of the two grids of 1.77 mm. In order to achieve mating of the module to the board at every site alignment of the pins and their respective connectors is critical.

Figure 4:
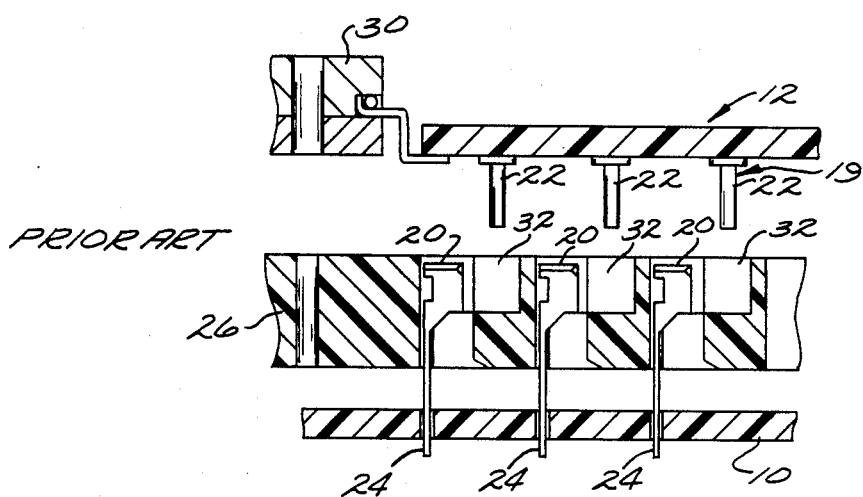
FIG. 4 is a cross sectional view of a portion of a module along with a portion of a printed wire board in which prior art bifurcated spring members are mounted.
Figure 5:
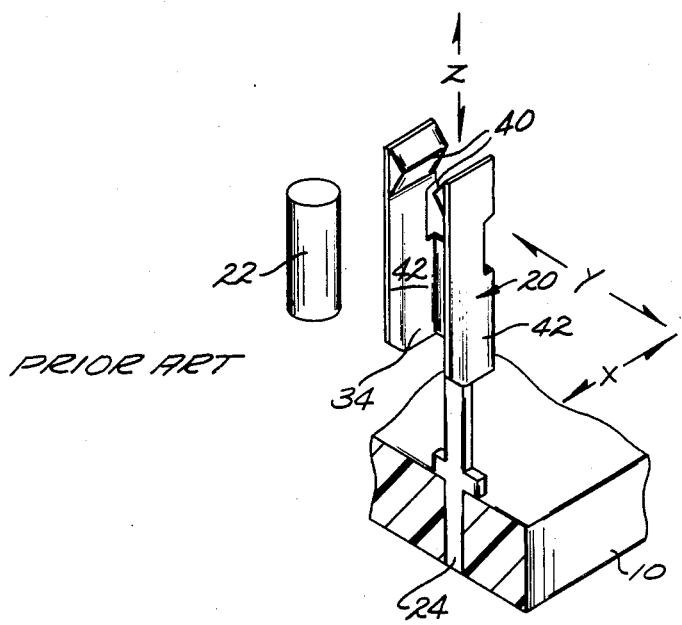
FIG. 5 is a perspective view of a pin and bifurcated contact spring which has been used with the modules of FIGS. 1 and 2 to interconnect I/O sites on the module substrate with plated through holes on the printed wiring board.

In the processor system referenced above modules 12 are designed to be field replaceable by means of a contact spring connector which is soldered to board 10 and adapted to removably receive the modules. In order to provide for inherent misalignment in pin-contact spring systems due to manufacturing tolerances and due to the relative rigidity of the brazed pins, the contact springs are provided with some flexibility. As seen in FIGS. 4 and 5, a contact spring 20 is formed as a three sided cage which receives pin 22 in the open side thereof. Contact springs 20 are formed with a solder tail 24 which are received in plated through apertures in board 10 and are soldered thereto. A plastic frame 26 is placed around the contact springs 20 allowing limited motion along the X-axis. Module 12 is placed over the contact spring array utilizing first proximate guide pins through apertures 28 in frame 30 (FIG. 3) so that the pins 22 are brought down in the Z direction into spaces 32 adjacent the open sides 34 of contact springs 20. Then utilizing precise guide pins 36, the module is moved transversely in the X-direction so that pins 22 are forced between contact surfaces 40. This allows limited misalignment and avoids placing excessive compressive forces on substrate 14.

In order to provide the appropriate level of contact force, the space between opposite sides 42 of contact springs 20 must be very accurately set, as by special dies. This along with the expensive brazed pin construction results in a relatively expensive interconnection system which is nevertheless susceptible to misalignment problems due to the limited flexibility of the contact springs. For example, contact springs are relatively inflexible in the Y direction so that pin misalignment in that direction can cause engagement problems.

Figure 6:
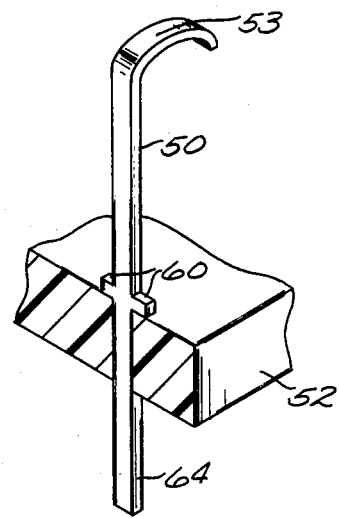
FIG. 6 is a view similar to FIG. 5 showing a "J" configured cantilever beam spring contact according to the present invention.
Figure 7:
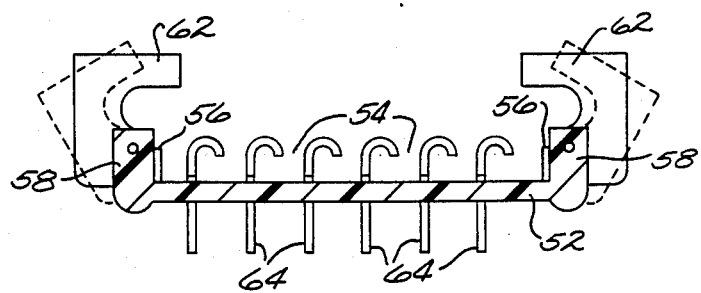
FIG. 7 is a cross sectional view of a socket body in which a plurality of contact springs of the type shown in FIG. 6 are mounted.

In accordance with a feature of the present invention, contact engagement with module 12 is effected between contact springs mounted in a socket body and biased against metal pads disposed on the bottom surface of substrate 14 without the use of intervening pins. As seen in FIGS. 6-8, generally "J" shaped contact springs 50 are mounted in a socket body 52 formed of suitable electrically insulative material such as a glass filed polyphenylene oxide so that the curved portion 53 of the "J" configuration projects into a central seating area 54 above a seating surface 56 formed about the inner periphery of upstanding said wall 58 of the socket body. Seating surface 56 lies in a plane adapted to receive the bottom surface of module 12. For purposes of clarity of illustration only six contact springs are shown however it will be understood that for the application described above socket body 52 will mount an array of contact springs of the same staggered grid arrangement and same number as that used for the conductive pads on the bottom surface of substrate 14, as in other words, 2 interspersed grids of rows and columns of 30 contact springs.

Contacts 50 are in the form of a cantilever beam formed of suitable material having good electrical and spring properties such as beryllium copper coated with a noble metal. Contacts 50 are preferably provided with tabs 60 which are used to place surface 53 of the contact a selected distance above the seating surface 56. Socket 52 is provided with pivotable ears 62 which are movable between open (dashed line position in FIG. 7) module receiving position and closed (solid line position in FIGS. 7 and 8) module retaining position.

Socket body 52 with the contact springs 50 mounted therein are placed on circuit board 10 so that depending solder tail portions 64 are received in plated holes in board 10 and permanently soldered thereto. A module 12 is then placed in socket 52 using a suitable guide system such as reference pins and guide holes similar to guide hole 28 of FIG. 3 to permit movement in the Z direction until the module is firmly seated on seating surface 56 at which point ears 62 are moved to the module retaining position. Ears 62 are then locked in place using any suitable locking means such as screw fasteners or the like.

It will be noted that as substrate 12 is moved in the Z direction toward seating surface 56 that surface 53 of contact springs 50 will be pushed downwardly to provide the desired contact force and as this occurs there will be a slight wiping motion to thereby assure clean contact mating surfaces.

As seen in FIG. 9, a socket body 70 made of suitable electrically insulative material such as a glass filled polyphenylene oxide is provided with a pattern of recesses 72 formed in the body in accordance with the pattern of conductive pads formed on substrate 14. For purposes of simplicity and clarity of illustration, only six are shown in FIG. 9 however it will be understood that for the application described above socket body 70 will be formed with an array of recesses of the same staggered interposed grid arrangement of rows and columns of 30 each.

An aperature 74 is formed in the bottom wall 76 in communication with each recess. A coil spring 80 formed of suitable electrically conductive material having good spring characteristics, such as beryllium copper coated with a noble metal, is received in each recess. A solder tail 82 depends downwardly from each spring through its respective aperture 74. Although solder tail 82 is shown as being formed integrally with spring 80, it may be formed of a separate element and be electrically connected to spring 80 if preferred.

According to a feature of the invention, it is preferred to form coil spring 80 in the configurations of a cone so that the only movement of which spring 80 is capable is in the Z direction to provide greater accuracy for alignment of the contact springs with the conductive pads of substrate 14. The bottom portion of contact spring 80 forming base of the cone conforms closely to the wall surfaces defining recess 72 to accurately position the contact spring in the X and Y directions.

Socket body 70 is provided with suitable module retaining means such as pivotable latches 84 which are movable between an open, module receving position (not shown) and a closed, module retaining position as shown in FIG. 9.

Socket body 70 with the contact springs 80 mounted therein are placed on circuit board 10 so that depending solder tails 82 are received in plated through holes in board 10 and permanently soldered thereto. A module 12 is then placed is socket 70 using a suitable guidance system such as referenced pins and guide holes similar to guide holes 28 of FIG. 3 to permit movement in the Z direction until the module is firmly seated on a seating surface 86 formed in the socket body. Seating surface 86 lies in a plane adapted to receive the bottom surface of module 12. At this time latches 84, which previously were pivoted into the module receiving position, are now pivoted into the module retaining position. Latches 84 are then locked into position using any suitable means such as a catch or a threaded member.

The coil portion of contact spring 80 have a length chosen so that the upper portion extends a selected distance above the plane in which seating surface 86 lies as shown in dashed lines so that as module 12 is moved toward seat 86, conductive pads 88 will engage contact springs 80 and deform them in the Z direction to produce the selected amount of contact force.

Although the above described interconnection systems do not employ a zero insertion force system, the insertion force is limited to that which is selected to be the ultimate contact force so that the substrate is not subjected to any additional forces in the interconnection process.

In view of the above it will be seen that the present invention provides a simple yet reliable interconnection system, one which obviates pin misalignment problems by making contact directly to the conductive pads at the I/O sites on the I.C. interconnection substrate. It should also be noted that it is within the purview of the invention to employ surface mount leads rather than solder tail stems for interconnection with the printed wiring board if so desired.

It is to be understood that the specific embodiment of the invention which has been described is merely illustrative and that modifications may be made by those skilled in the art without departing from the scope the invention as set forth in the appended claims.

What is claimed is:

1. An interconnection device comprising:
    a socket body formed of electrically insulative material, the body having a top portion and a bottom wall, a generally planar seating surface formed in the top portion, the surface extending in an X and Y direction, a pattern of recesses formed in the body extending from the seating surface to the bottom wall, a respective pin receiving aperture formed in the bottom wall in communication with each recess,
    an electrically conductive coiled contact spring having first and second ends received in each recess with the first end seated on the bottom wall, an electrically conductive pin extending from the first end of each contact spring through a respective aperture, the second end of the contact spring in its at rest position extending above the planar seating surface in a Z direction, a generally plate like module having a plurality of electrically conductive pads formed on a bottom surface of the module, the pads arranged in a pattern matching that of the recesses, the module receivable on the generally planar seating surface, reference surface means to assure proper location of the module relative to the socket body so that the pattern of electrically conductive pads is aligned with the pattern of recesses, and means to lock the module tightly against the planar seating surface with the springs depressed and in electrically conductive relationship with the pads, characterized in that the coiled springs are conical in configuration, the first end of the coiled springs forming the base of the conical configuration and being closely conformed to the wall surfaces defining the recesses in which the springs are received, whereby movement of the contact springs is limited essentially to the Z direction for greater accuracy in alignment of the contact springs with the conductive pads.

2. An interconnection device according to claim 1 in which the means to lock the module comprises a plurality of pivotable latches mounted on the body movable between an open module receiving position and a closed module retaining position.

3. An interconnection device comprising:

a socket body formed of electrically insulative material, the body having a top portion and a bottom wall, a generally planar seating surface formed in the top portion, the surface extending in an X and Y direction, a pattern of recesses formed in the body extending from the seating surface to the bottom wall, a respective pin receiving aperture formed in the bottom wall in communication with each recess, an electrically conductive coiled contact spring having first and second ends received in each recess with the first end seated on the bototm wall, an electrically conductive pin extending from the first end of each contact spring through a respective aperture, the second end of the contact spring in its at rest position extending above the planar seating surface in a Z direction, reference surface means to assure proper location of a plate like module relative to the socket body so that a pattern of electrically conductive pads on a bottom surface of the module is alignable with the pattern of recesses, and means to lock the module tightly against the planar seating surface with the contact springs depressed and in electrically conductive relationship with the pads characterized in that the coiled springs are conical in configuration, the first end of the coiled springs forming the base of the conical configuration and being closely conformed to the wall surfaces defining the recesses in which the springs are received, whereby movement of the contact springs is limited essentially to the Z direction for greater accuracy in alignment of the contact springs with the conductive pads.

4. An interconnection device according to claim 3 in which the means to lock the module comprises a plurality of pivotable latches mounted on the body movable between an open module receiving position and a closed module retaining position.

* * * * *